(12) United States Patent
Liou et al.

(10) Patent No.: US 10,777,556 B2
(45) Date of Patent: *Sep. 15, 2020

(54) SEMICONDUCTOR DEVICE AND METHOD FOR FABRICATING THE SAME

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 124 days.

This patent is subject to a terminal disclaimer.

(21) Appl. No.: 16/149,125

(22) Filed: Oct. 1, 2018

(65) Prior Publication Data

US 2019/0043861 A1    Feb. 7, 2019

Related U.S. Application Data

(63) Continuation of application No. 15/802,472, filed on Nov. 3, 2017, now Pat. No. 10,121,790, which is a
(Continued)

(30) Foreign Application Priority Data

Nov. 15, 2016    (TW) .............................. 105137190 A

(51) Int. Cl.
*H01L 27/092* (2006.01)
*H01L 21/8238* (2006.01)
(Continued)

(52) U.S. Cl.
CPC ...... *H01L 27/0924* (2013.01); *H01L 21/0217* (2013.01); *H01L 21/02129* (2013.01); *H01L 21/2256* (2013.01); *H01L 21/823412* (2013.01); *H01L 21/823418* (2013.01); *H01L 21/823431* (2013.01); *H01L 21/823437* (2013.01); *H01L 21/823468* (2013.01); *H01L 21/823807* (2013.01); *H01L 21/823814* (2013.01); *H01L 21/823821* (2013.01);
(Continued)

(58) Field of Classification Search
CPC ..... H01L 21/823821; H01L 21/823431; H01L 21/845; H01L 27/0886; H01L 27/0924; H01L 27/10826; H01L 27/10879; H01L 27/1211; H01L 29/66795–66818; H01L 29/785–7856
See application file for complete search history.

(56) References Cited

U.S. PATENT DOCUMENTS 9,837,417 B1    12/2017 Liou
10,121,790 B2 *  11/2018 Liou ................. H01L 29/66803
(Continued)

OTHER PUBLICATIONS

Tung, Title of Invention: Semiconductor Device and Method for Fabricating the Same, U.S. Appl. No. 15/062,217, filed Mar. 7, 2016.

*Primary Examiner* — Bryan R Junge
(74) *Attorney, Agent, or Firm* — Winston Hsu

(57) ABSTRACT

A semiconductor device includes a semiconductor substrate, semiconductor fins; and a first fin bump between the semiconductor fins. The first fin bump includes a first sidewall spacer. The first sidewall spacer includes a solid-state dopant source layer and an insulating buffer layer.

10 Claims, 5 Drawing Sheets

Related U.S. Application Data continuation of application No. 15/378,050, filed on Dec. 14, 2016, now Pat. No. 9,837,417.

(51) Int. Cl.
  *H01L 27/088* (2006.01)
  *H01L 21/02* (2006.01)
  *H01L 21/8234* (2006.01)
  *H01L 21/225* (2006.01)
  *H01L 29/66* (2006.01)

(52) U.S. Cl.
  CPC ............... *H01L 21/823828* (2013.01); *H01L 21/823864* (2013.01); *H01L 27/0886* (2013.01); *H01L 29/66803* (2013.01); *H01L 21/823892* (2013.01)

(56) References Cited

U.S. PATENT DOCUMENTS

| | | |
|---|---|---|
| 2013/0309838 A1 | 11/2013 | Wei |
| 2013/0330889 A1 | 12/2013 | Yin |
| 2015/0069528 A1 | 3/2015 | Chiang |
| 2015/0243739 A1 | 8/2015 | Chen |
| 2016/0056156 A1 | 2/2016 | Ghani |
| 2016/0163837 A1 | 6/2016 | Wu |
| 2016/0181360 A1 | 6/2016 | Wang |
| 2016/0190137 A1 | 6/2016 | Tsai |
| 2016/0315081 A1 | 10/2016 | Park |
| 2017/0092498 A1 | 3/2017 | Li |
| 2017/0200656 A1 | 7/2017 | Li |

* cited by examiner

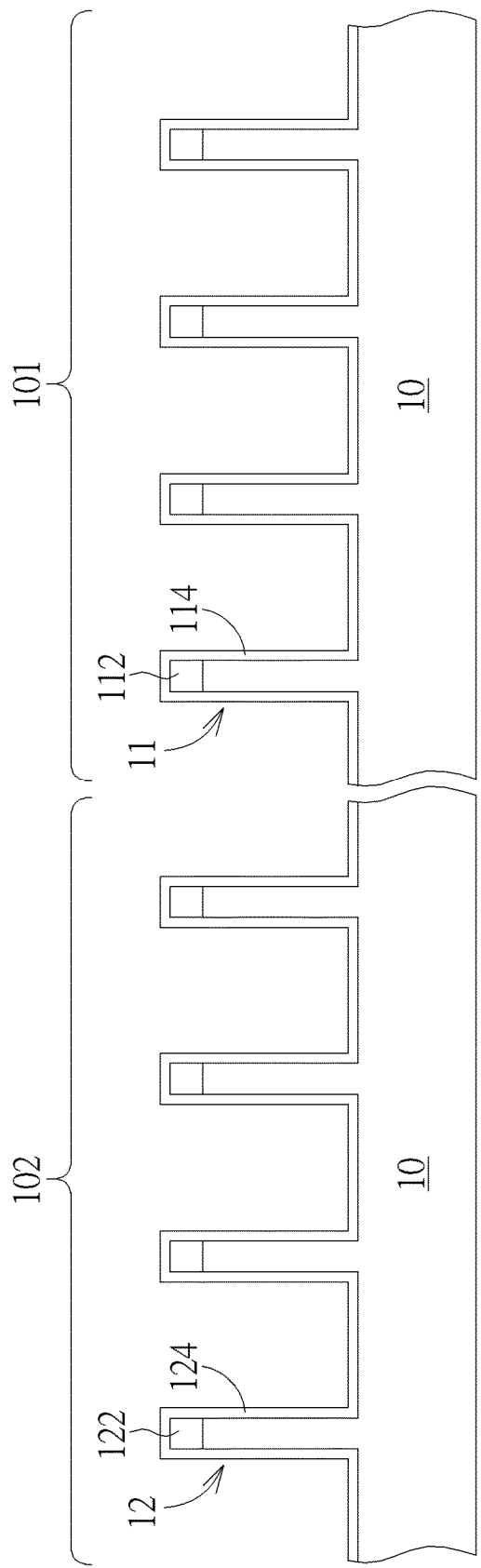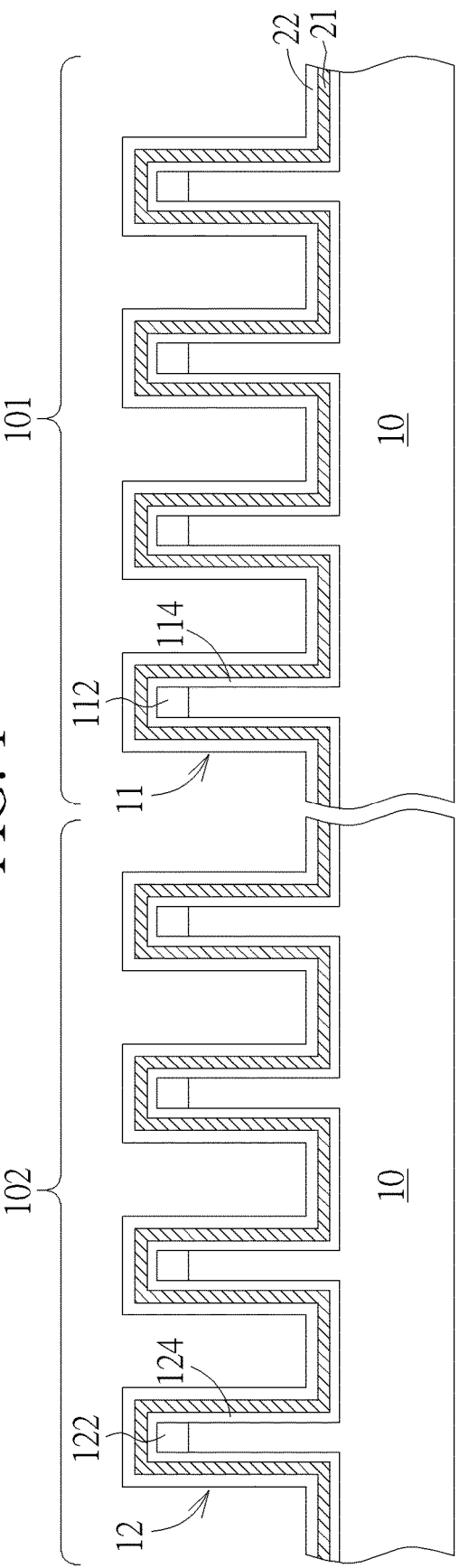

SEMICONDUCTOR DEVICE AND METHOD FOR FABRICATING THE SAME

CROSS REFERENCE TO RELATED APPLICATIONS

This application is a continuation of U.S. application Ser. No. 15/802,472 filed Nov. 3, 2017, which itself is a continuation of U.S. application Ser. No. 15/378,050 filed Dec. 14, 2016, now U.S. Pat. No. 9,837,417 B1. The above-mentioned applications are included in their entirety herein by reference.

BACKGROUND OF THE INVENTION

1. Field of the Invention

The present invention relates generally to a semiconductor transistor device and a method of fabricating the same. More particularly, the present invention relates to a semiconductor transistor device using a solid state doping (SSD) technique to form a doped layer in the lower half of a fin structure and a method of fabricating the same.

2. Description of the Prior Art

In recent years, as the dimensions of key components continue to shrink, the development of planar field effect transistor elements has been faced with process limitations. In order to overcome process limitations, it has become a mainstream trend to replace planar transistor elements with non-planar field-effect transistor elements, such as fin field effect transistors (Fin FET) elements.

Because the three-dimensional structure of the fin field effect transistor element can increase the contact area between the gate electrode and the fin structure, the control of the gate electrode to the carrier channel region can be further increased, thereby reducing the drain induced barrier lowering (DIBL) effect and suppressing the short-channel effect (SCE).

Moreover, because the fin field effect transistor element has a wider channel width at the same gate electrode length, a double of the drain drive current can be obtained. Even the threshold voltage of the transistor element can be controlled by adjusting the work function of the gate electrode.

However, there are still many bottlenecks in the design of the fin structure, which affects the leakage current and the overall electrical performance of the fin FET devices. Therefore, how to improve the prior process of fin field effect transistor is an important issue today.

SUMMARY OF THE INVENTION

According to one embodiment, the present invention provides a method for fabricating a semiconductor device. First, a semiconductor substrate having a first region and a second region is provided. A plurality of first semiconductor fins is formed in the first region and a plurality of second semiconductor fins is formed in the second region. A first solid-state dopant source layer is then formed within the first region on the semiconductor substrate. A first insulating buffer layer is formed on the first solid-state dopant source layer. A second solid-state dopant source layer is formed within the second region on the semiconductor substrate. A second insulating buffer layer is formed on the second solid-state dopant source layer and on the first insulating buffer layer. A first fin bump is formed in the first region between the first semiconductor fins and a second bump is formed in the second region between the second semiconductor fins.

The first fin bump includes a first sidewall spacer and the second bump includes a second sidewall spacer. The first sidewall spacer has a structure that is different from that of the second sidewall spacer.

The first sidewall spacer does not cover a top surface of the first fin bump, and the second sidewall spacer does not cover a top surface of the second fin bump.

According to another embodiment, the present invention provides a semiconductor device, including: a semiconductor substrate having a first region and a second region; a plurality of first semiconductor fins in the first region; a plurality of second semiconductor fins in the second region; a first solid-state dopant source layer within the first region on the semiconductor substrate, a first insulating buffer layer on the first solid-state dopant source layer; a second solid-state dopant source layer within the second region on the semiconductor substrate; a second insulating buffer layer on the second solid-state dopant source layer and on the first insulating buffer layer; a first fin bump in the first region; and a second fin bump in the second region.

The first fin bump includes a first sidewall spacer and the second fin bump includes a second sidewall spacer. The first sidewall spacer has a structure that is different from that of the second sidewall spacer.

The first sidewall spacer does not cover a top surface of the first fin bump, and the second sidewall spacer does not cover a top surface of the second fin bump.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 are schematic, cross-sectional diagrams showing an exemplary method of fabricating a semiconductor transistor device in accordance with one embodiment of the invention.

DETAILED DESCRIPTION

Figure 3:
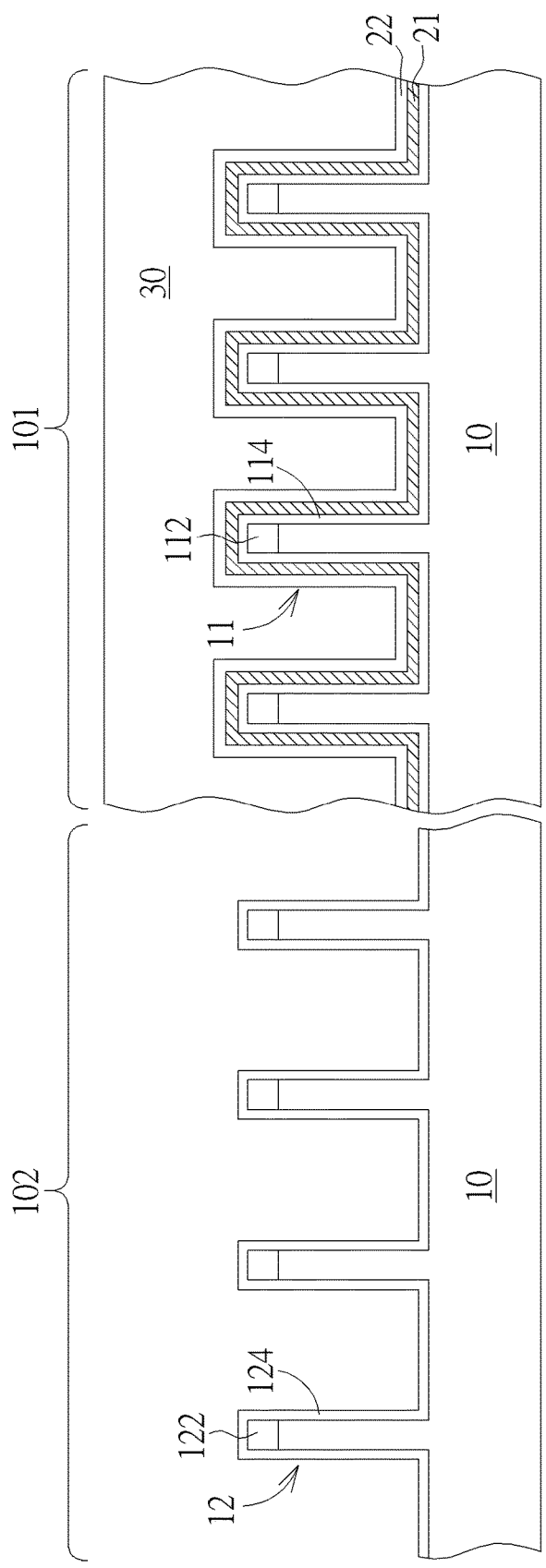

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Before describing the preferred embodiment, the following description will be given for specific terms used throughout the specification.

The term "etch" or "etching" is used herein to generally describe a fabrication process of patterning a material, such that at least a portion of the material remains after the etch is completed. For example, it should be understood that the process of etching silicon involves the steps of patterning a photoresist layer above the silicon, and then removing the areas of silicon no longer protected by the photoresist layer. As such, the areas of silicon protected by the photoresist layer would remain behind after the etch process is complete. However, in another example, etching may also refer to a process that does not use a photoresist layer, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

The term "substrate," "semiconductor substrate" or "wafer" as described throughout, is most commonly a silicon substrate or a silicon wafer. However, term "substrate" or "wafer" may also refer to any semiconductor material such as germanium, gallium arsenide, indium phosphide, and the like. In other embodiments, the term "substrate" or "wafer" may be non-conductive, such as a glass or sapphire wafer.

FIG. 1 to FIG. 9 are schematic, cross-sectional diagrams showing an exemplary method of fabricating a semiconductor transistor device in accordance with one embodiment of the invention. First, as shown in FIG. 1, a semiconductor substrate 10 is provided. The semiconductor substrate 10 comprises a first region 101 and a second region 102. For example, the first region 101 may be a NMOS region and the second region 102 may be a PMOS region. The first region 101 and the second region 102 do not overlap each other. Next, a plurality of first semiconductor fins 11 and a plurality of second semiconductor fins 12 are formed in the first region 101 and the second region 102, respectively.

The process of forming a semiconductor fin on a semiconductor substrate 10 is well known and may include steps such as lithography and etching, which are not described in any detail.

According to the embodiment of the invention, the top of each first semiconductor fins 11 may have a mask layer 112, and the top of each second semiconductor fins 12 may have a mask layer 122, wherein the mask layers 112 and 122 may include silicon nitride or silicon oxide, but are not limited thereto. Further, an oxide layer 114 and an oxide layer 124 may be selectively formed on each of the first semiconductor fins 11 and each of the second semiconductor fins 12, respectively. The oxide layers 114 and 124 may include silicon oxide, for example, in-situ steam generation (ISSG) oxide layer, but are not limited thereto.

Next, as shown in FIG. 2, a first solid-state dopant source layer 21 is formed on the semiconductor substrate 10, for example, by a chemical vapor deposition method. The first solid-state dopant source layer 21 is deposited conformally on the semiconductor substrate 10. According to the embodiment of the present invention, the first solid-state dopant source layer 21 may include a borosilicate glass (BSG) layer, but is not limited thereto. A first insulating buffer layer 22 is formed on the first solid-state dopant source layer 21. The first insulating buffer layer 22 may comprise silicon nitride, but is not limited thereto. The first insulating buffer layer 22 may be formed by a chemical vapor deposition method.

As shown in FIG. 3, the first region 101 is then masked by an etching mask 30, such as a photoresist, and the second region 102 is exposed. An etching process is then performed to remove the first solid-state dopant source layer 21 and the first insulating buffer layer 22 not covered by the etching mask 30 from the second region 102, to thereby expose a plurality of second semiconductor fins 12 in the second region 102. Subsequently, the etching mask 30 is removed.

Figure 4:
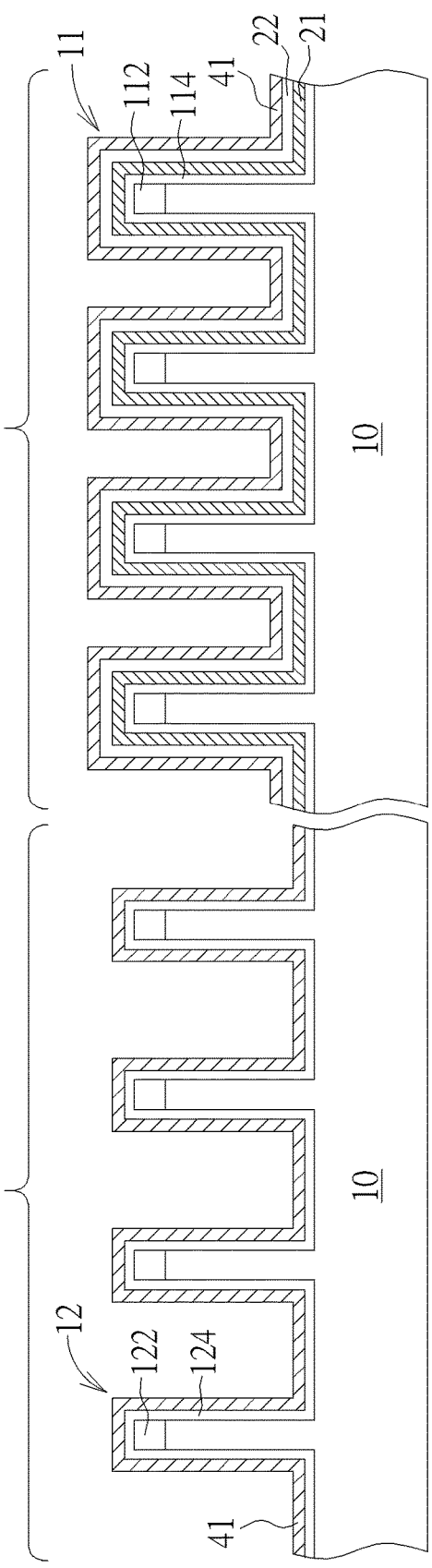

Next, as shown in FIG. 4, the second solid-state dopant source layer 41 is deposited on the first region 101 and the second region 102 on the semiconductor substrate 10 in a blanket manner, for example, by a chemical vapor deposition method. The second solid-state dopant source layer 41 is deposited conformally on the semiconductor substrate 10. According to the embodiment of the present invention, the second solid-state dopant source layer 41 may include a phosphosilicate glass (PSG) layer or an arsenic silicate glass (AsSG) layer, but is not limited thereto.

Figure 5:
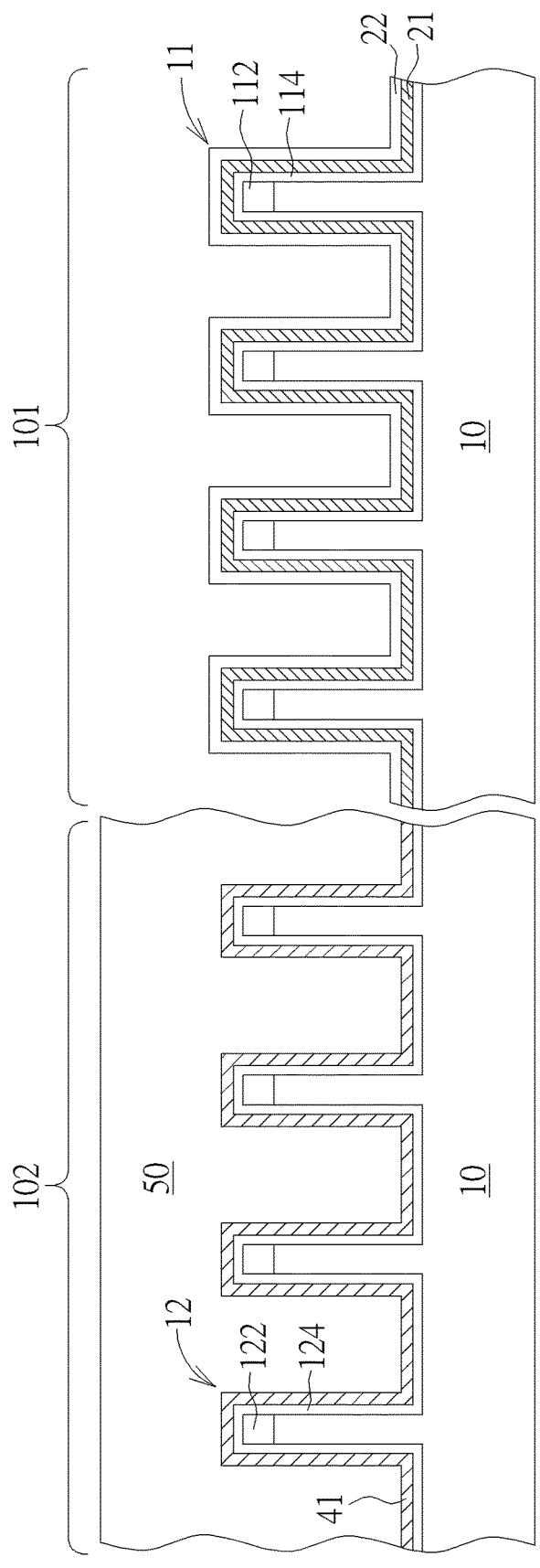

As shown in FIG. 5, the second region 102 is then masked by another etching mask 50, such as a photoresist, and the first region 101 is exposed. An etching process is then performed to remove the second solid-state dopant source layer 41 not covered by the etching mask 50 from the first region 101, to thereby expose the first insulating buffer layer 22 in the first region 101. Subsequently, the etching mask 50 is removed.

Figure 6:
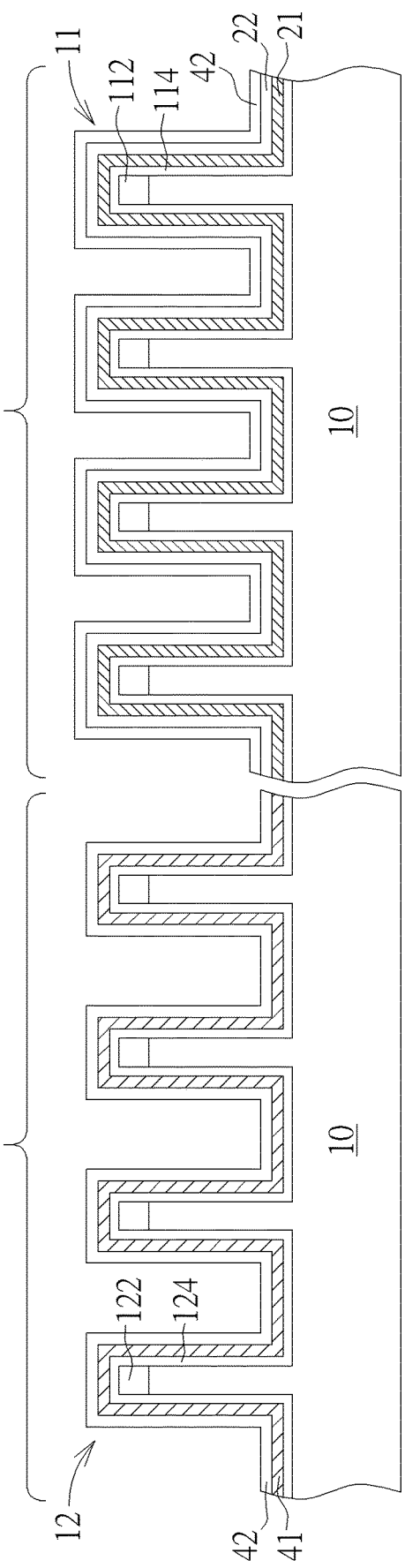

As shown in FIG. 6, a second insulating buffer layer 42 is formed on the first insulating buffer layer 22 in the first region 101 and on the second solid-state dopant source layer 41 in the second region 102. The second insulating buffer layer 42 may include silicon nitride, but is not limited thereto. The second insulating buffer layer 42 may be formed by a chemical vapor deposition method.

Figure 7:
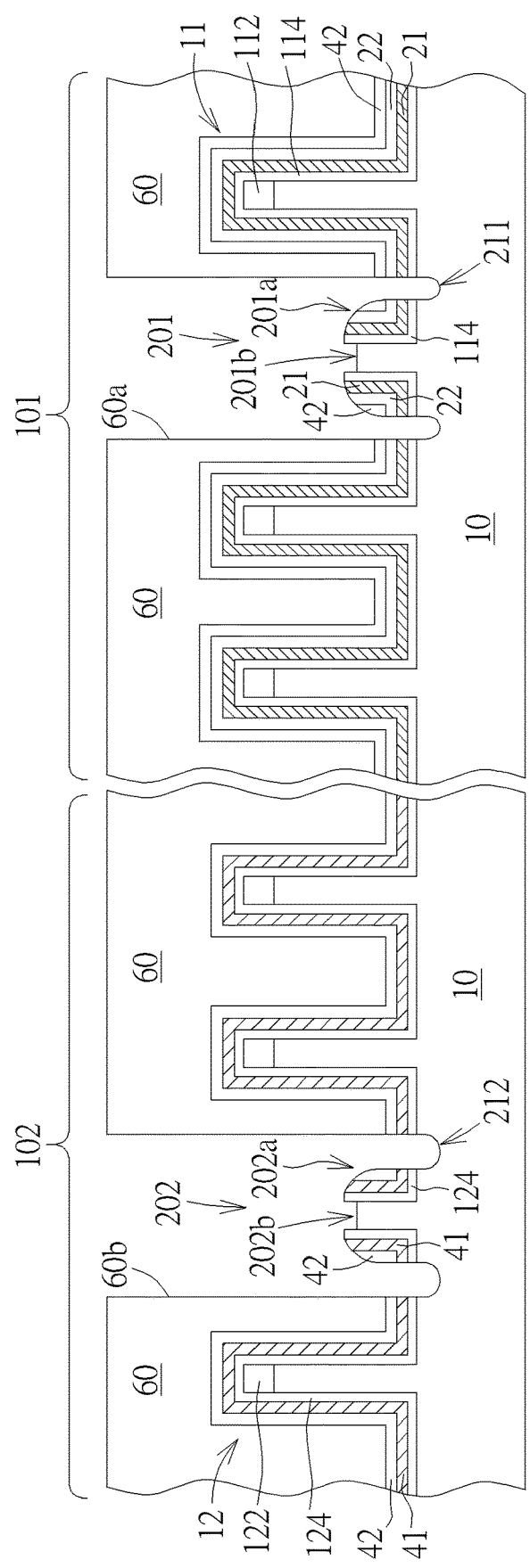

Next, as shown in FIG. 7, the first region 101 and the second region 102 are masked by an etching mask 60, such as a photoresist. The etching mask 60 has openings 60a and 60b, wherein the opening 60a merely exposes a portion of the first semiconductor fins 11 within the first region 101 and the opening 60b merely exposes a portion of the second semiconductor fins 12 within the second region 102.

An anisotropic dry etching process is then performed to etch the first semiconductor fins 11 and the second semiconductor fins 12 exposed by the openings 60a and 60b, so that a first fin bump 201 is formed in the first region 101 between the first semiconductor fins 11 and a second fin bump 202 in the second region 102 between the second semiconductor fins 12, wherein the first fin bump 201 includes a first sidewall spacer 201a and the second fin bump 202 includes a second sidewall spacer 202a. The first sidewall spacer 201a has a structure that is different from that of the second sidewall spacer 202a.

According to the embodiment of the invention, the first sidewall spacer 201a includes a portion of the oxide layer 114, a portion of the first solid-state dopant source layer 21, a portion of the first insulating buffer layer 22, and a portion of the second insulating buffer layer 42. The second sidewall spacer 202a includes a portion of the oxide layer 124, a portion of the second solid-state dopant source layer 41, and a portion of the second insulating buffer layer 42.

The first sidewall spacer 201a does not cover a top surface of the first fin bump 201, and the second sidewall spacer 202a does not cover a top surface of the second fin bump 202. As shown in FIG. 7, at this time, the top surface of the first fin bump 201 is an exposed silicon surface which forms a recessed region 201b between the first sidewall spacer 201a. The top surface of the second fin bump 202 is an exposed silicon surface which forms a recessed region 202b between the second sidewall spacer 202a. Thereafter, the etching mask 60 is removed.

According to the embodiment of the invention, when the first fin bump 201 and the second fin bump 202 are formed, a recessed region 211 and a recessed region 212 are respectively formed on the semiconductor substrate 10 next to the first fin bump 201 and the second fin bump 202.

Figure 8:
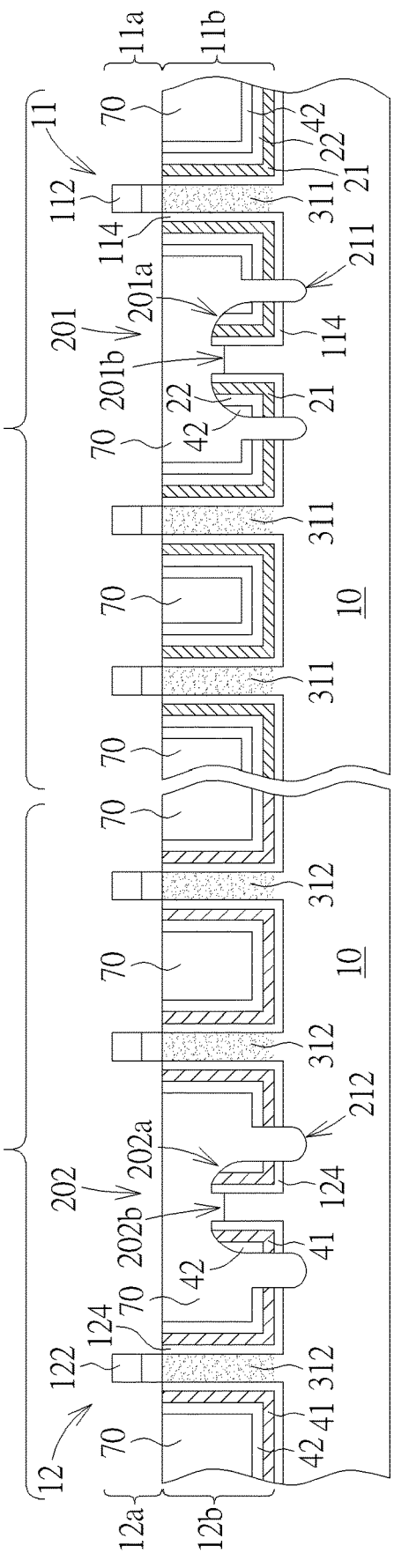

Next, as shown in FIG. 8, a dielectric layer 70, for example, silicon dioxide layer, is formed on the second insulating buffer layer 42, the first fin bump 201, and the second fin bump 202. According to the embodiment of the invention, the dielectric layer 70 may be formed by a chemical vapor deposition method, but is not limited thereto. According to the embodiment of the invention, the dielectric layer 70 fills into the recessed region 201b of the first fin bump 201, the recessed region 202b of the second fin bump 202, the recessed region 211 next to the first fin bump 201, and the recessed region 212 next to the second fin bump 202. Optionally, a planarization process is then performed.

Subsequently, the dielectric layer 70, the second insulating buffer layer 42, the first insulating buffer layer 22, the first solid-state dopant source layer 21, the second solid-state dopant source layer 41, the oxide layer 114, and the oxide layer 124 are recessed to a level below a top surface of the plurality of first and second semiconductor fins 11 and 12, to thereby expose protruding portions 11a and 12a of each of the plurality of first and second semiconductor fins 11 and 12 above sub-fin regions 11b and 12b of each of the plurality of first and second semiconductor fins 11 and 12.

According to the embodiment of the invention, the mask layer 112 and 114 may also be selectively removed in this etching process, but are not limited thereto.

Next, a thermal doping process is performed to drive dopants from the remaining first solid-state dopant source layer 21 and the second solid-state dopant source layer 41 into the sub-fin regions 11b and 12b of each of the plurality of the first semiconductor fins 11 and the second semiconductor fins 12, respectively. In this way, the dopant regions 311 and 312 are formed in the sub-fin regions 11b and 12b of the first semiconductor fins 11 and the second semiconductor fins 12, respectively.

Figure 9:
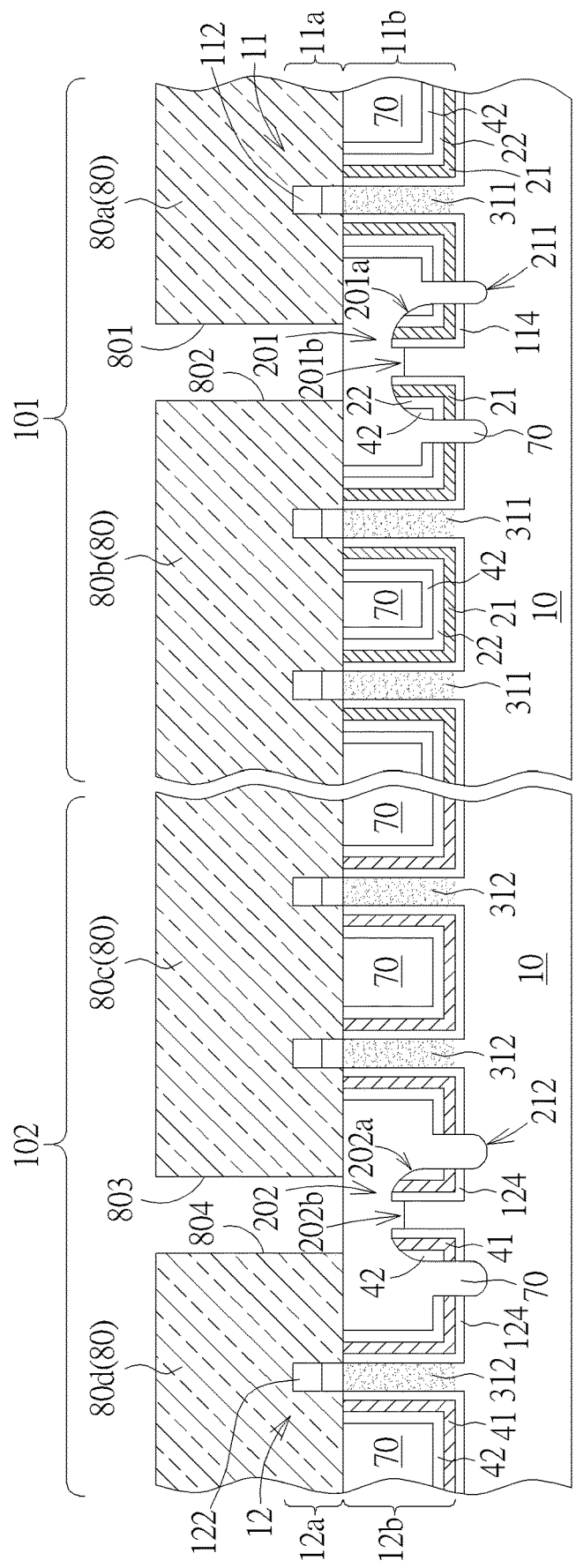

As shown in FIG. 9, a gate electrode 80 is formed on the dielectric layer 70. The gate electrode 80 traverses the protruding portions 11a and 12a of each of the plurality of first and second semiconductor fins 11 and 12. According to the embodiment of the invention, the gate electrode 80 may include a metal gate. Source and drain regions (not shown) are formed in the protruding portions 11a and 12a of each of the plurality of first and second semiconductor fins 11 and 12, on two opposite sides of the gate electrode 80. Next, the SiGe or SiP epitaxy may be formed in the source and drain regions.

According to the embodiment of the invention, there is further included a step of cutting the gate electrode 80 into gate segments 80a, 80b, 80c and 80d. Each of the gate segments 80a, 80b, 80c and 80d has agate edge 801, 802, 803 and 804 that is partially overlapped with the first fin bump 201 or the second fin bump 202 when viewed from above. The gate edges 801, 802, 803 and 804 do not completely overlap with the first fin bump 201 or the second fin bump 202 when viewed from above.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor substrate;
   a plurality of semiconductor fins; and
   a first fin bump between the plurality of semiconductor fins, wherein the first fin bump comprises a first sidewall spacer, and wherein the first sidewall spacer comprises a solid-state dopant source layer and an insulating buffer layer.

2. The semiconductor device according to claim 1, wherein the solid-state dopant source layer comprises a borosilicate glass (BSG) layer.

3. The semiconductor device according to claim 1, wherein the solid-state dopant source layer comprises a phosphosilicate glass (PSG) layer or an arsenic silicate glass (AsSG) layer.

4. The semiconductor device according to claim 1, wherein the insulating buffer layer comprises silicon nitride.

5. The semiconductor device according to claim 1, wherein the insulating buffer layer is disposed on the solid-state dopant source layer.

6. The semiconductor device according to claim 1 further comprises a recessed region in the semiconductor substrate and next to the first fin bump.

7. The semiconductor device according to claim 6, wherein the recessed region is filled with a dielectric layer.

8. The semiconductor device according to claim 7 further comprises a gate segment on the dielectric layer and a gate edge of the gate segment that is partially overlapped with the first fin bump.

9. The semiconductor device according to claim 1, wherein the first sidewall spacer has a top surface that is higher than that of the first fin bump.

10. The semiconductor device according to claim 1 further comprises a second fin bump, wherein the second fin bump comprises a second sidewall spacer that has different structure from the first sidewall spacer.

* * * * *